(12) United States Patent
Kim et al.

(10) Patent No.: US 9,455,294 B2
(45) Date of Patent: Sep. 27, 2016

(54) IMAGE SENSOR AND METHOD OF FABRICATING THE SAME

(71) Applicant: SAMSUNG ELECTRONICS CO., LTD., Suwon-Si, Gyeonggi-Do (KR)

(72) Inventors: Jin-Ho Kim, Seoul (KR); Young-Hoon Park, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 14/562,923

(22) Filed: Dec. 8, 2014

(65) Prior Publication Data

US 2015/0145093 A1 May 28, 2015

Related U.S. Application Data

(63) Continuation of application No. 13/672,035, filed on Nov. 8, 2012, now Pat. No. 8,933,530.

(30) Foreign Application Priority Data

Mar. 20, 2012 (KR) .................. 10-2012-0028302

(51) Int. Cl.
  *H01L 31/02* (2006.01)
  *H01L 31/0216* (2014.01)
  *H01L 27/146* (2006.01)
  *H01L 31/0232* (2014.01)

(52) U.S. Cl.
  CPC ..... *H01L 27/1464* (2013.01); *H01L 27/14636* (2013.01); *H01L 27/14643* (2013.01); *H01L 31/02019* (2013.01); *H01L 31/02327* (2013.01); *H01L 27/14683* (2013.01)

(58) Field of Classification Search
  CPC .................. H01L 27/14636; H01L 27/14632; H01L 27/14627; H01L 27/14621; H01L 27/14609; H01L 27/14625; H01L 27/14603; H01L 27/14643; H01L 27/14605
  See application file for complete search history.

(56) References Cited

U.S. PATENT DOCUMENTS

| | | | |
|---|---|---|---|
| 8,227,288 B2* | 7/2012 | Wang et al. ................. | 438/72 |
| 8,247,306 B2* | 8/2012 | Nakazawa et al. ........... | 438/401 |
| 8,569,856 B2* | 10/2013 | Qian et al. ................. | 257/459 |
| 8,754,494 B2* | 6/2014 | Kawasaki et al. ........... | 257/434 |
| 2004/0164981 A1 | 8/2004 | Fujita et al. | |
| 2010/0181637 A1* | 7/2010 | Harada et al. ................ | 257/459 |
| 2010/0237452 A1* | 9/2010 | Hagiwara et al. ............ | 257/432 |
| 2010/0259657 A1 | 10/2010 | Lee et al. | |
| 2010/0264503 A1* | 10/2010 | Inoue et al. ................. | 257/432 |

(Continued)

FOREIGN PATENT DOCUMENTS

| | | |
|---|---|---|
| JP | 10242442 | 11/1998 |
| JP | 2006013979 | 1/2006 |

(Continued)

*Primary Examiner* — Victor A Mandala
(74) *Attorney, Agent, or Firm* — Volentine & Whitt, PLLC

(57) ABSTRACT

An image sensor includes a substrate having a front side and a back side, an insulating structure containing circuits on the front side of the substrate, contact holes extending through the substrate to the circuits, respectively, and a plurality of pads disposed on the backside of the substrate, electrically connected to the circuits along conductive paths extending through the contact holes, and located directly over the circuits, respectively. The image sensor is fabricated by a process in which a conductive layer is formed on the back side of the substrate and patterned to form the pads directly over the circuits.

6 Claims, 12 Drawing Sheets

(56) References Cited

U.S. PATENT DOCUMENTS

| | | | |
|---|---|---|---|
| 2011/0156113 A1 | 6/2011 | Jeon et al. | |
| 2011/0186951 A1* | 8/2011 | Pyo | 257/432 |
| 2011/0227180 A1* | 9/2011 | Murakoshi | 257/432 |
| 2012/0001286 A1* | 1/2012 | Yoon | 257/432 |
| 2012/0086092 A1* | 4/2012 | Yanagita et al. | 257/432 |
| 2012/0280348 A1* | 11/2012 | Chou et al. | 257/435 |
| 2013/0009270 A1* | 1/2013 | Tsai et al. | 257/459 |

FOREIGN PATENT DOCUMENTS

| | | |
|---|---|---|
| KR | 100889353 | 3/2009 |
| KR | 100992338 | 11/2010 |
| KR | 101037541 | 5/2011 |
| KR | 101056109 | 8/2011 |

* cited by examiner

IMAGE SENSOR AND METHOD OF FABRICATING THE SAME

This application is a continuation of U.S. application Ser. No. 13/672,035, filed Nov. 8, 2012, now U.S. Pat. No. 8,933,530, which claims priority from Korean Patent Application No. 10-2012-0028302 filed on Mar. 20, 2012 in the Korean Intellectual Property Office, the disclosure of which is hereby incorporated by reference in its entirety.

BACKGROUND

1. Field

The inventive concept generally relates to image sensors and to methods of fabricating the same. The inventive concept also relates to backside illuminated image sensors, to CMOS image sensors, and to methods of fabricating the same.

2. Description of the Related Art

Image sensors that employ semiconductor devices for converting an optical image into electrical signals include charge coupled devices (CCD) and complementary metal oxide semiconductor (CMOS) image sensors. Pixels of a CCD device are provided by MOS capacitors which are biased to convert photons into electric charges carriers. The electric charge carriers are read out through the capacitors. On the other hand, pixels of a CMOS image sensor include photoelectric conversion devices which absorb incident light and accumulate electric charges corresponding to the amount of the incident light, and a number of MOS transistors associated with each photoelectric conversion device and which process the output of the photoelectric conversion devices.

Thus, the photoconversion devices and signal processing circuits in CMOS image sensors can be integrated in a single chip. Accordingly, compared to CCD image sensors, CMOS image sensors are smaller. In addition, CMOS image sensors are less costly to manufacture and consume less power. Therefore, CMOS image sensors are favored in products with limited battery capacity. For these reasons, the use of CMOS image sensors is expanding.

Circuits of a CMOS image sensor comprise a plurality of layers of metal wiring which output optical signals respectively stored in the photoelectric conversion devices and an interlayer insulating layer. Accordingly, the reflection of incident light by the metal wiring layers or the adsorption of the incident light by the interlayer insulating layer would reduce the sensitivity of the sensor. In addition, reflected light absorbed by adjacent pixels would cause crosstalk.

In light of this, a backside illuminated (BI) image sensor has been proposed. A BI image sensor includes a substrate having a front side to which the interlayer insulating layer containing the layers of metal wiring is attached. The backside of the substrate is polished, and is oriented such that the incident light impinges the backside of the substrate. Thus, in such a BI image sensor, incident light is not reflected by the metal wiring layers or absorbed by the interlayer insulating layer.

SUMMARY

According to an aspect of the inventive concept, there is provided an image sensor which includes a substrate having a front side and a back side, an insulating structure on the front side of the substrate and comprising circuits, contact holes extending through the substrate and to the circuits, respectively, and a plurality of conductive pads disposed on the back side of the substrate and located directly over and electrically connected to the circuits along conductive paths extending through the contact holes, respectively.

According to another aspect of the inventive concept, there is provided an image sensor which includes a substrate having a front side and a back side, an insulating structure disposed on the front side of the substrate and comprising an insulating layer, a circuit, and a lower pad of conductive material within the insulating layer and electrically connected to the circuit, an upper pad of conductive material on the back side of the substrate and disposed directly over the circuit, a contact hole extending through the substrate and to the lower pad, and a contact extending in the contact hole and electrically connecting the upper pad and the lower pad.

According to another aspect of the inventive concept, there is provided an image sensor having a light receiving region and a circuit region extending around the light receiving region, and which includes a substrate having a front side and a back side, pixels disposed at the front side of the substrate in the light receiving region, driving circuits disposed on the front side of the substrate in the circuit region, and upper conductive pads on the back side of the substrate as vertically aligned with and electrically connected to the driving circuits, respectively.

According to still another aspect of the inventive concept, there is provided an image sensor having a light receiving region, and a circuit region extending around the light receiving region and whose outer boundary coincides with the outer periphery of the sensor, and which includes a substrate having a front side and a back side, pixel sensors located at the front side of the substrate in the light receiving region of the sensor, an insulating layer disposed on the front side of the substrate and covering the pixel sensors in the light receiving region, circuits disposed within the insulating layer in the circuit region, wiring disposed within the insulating layer in the light receiving region and electrically connecting the circuits to the active pixel sensor array, contact holes extending through the substrate and to the circuits, respectively, and conductive pads disposed on the back side of the substrate and located directly over and electrically connected to the circuits along conductive paths extending through the contact holes, respectively.

BRIEF DESCRIPTION OF THE DRAWINGS

The above and other aspects and features of the inventive concept will become more apparent from the following detailed description of preferred embodiments made with reference to the attached drawings, in which.

DETAILED DESCRIPTION OF THE PREFERRED EMBODIMENTS

Figure 1:
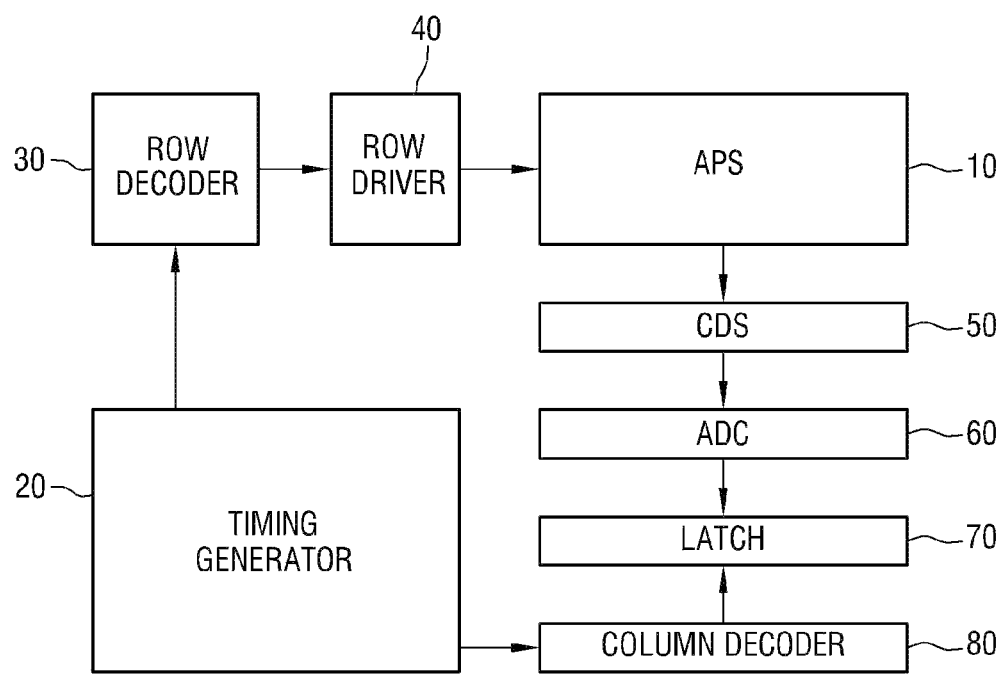
FIG. 1 is a block diagram of an image sensor according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Furthermore, spatially relative terms, such as "upper," "lower" and "over" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

Hereinafter, the inventive concept will be described using a backside illuminated (BI) image sensor, in which light is incident from a backside of a substrate, as an example. Here, the terms 'front side' and 'backside' of a substrate do not denote absolute directions but indicate relative directions or a positional relationship. In the following embodiments, a front side of a substrate may be defined as a direction or position in which the substrate is fabricated first in the fabrication of an image sensor, and a backside of the substrate may be defined as a direction or position opposite the front side of the substrate.

Embodiments of an image sensor according to the inventive concept will now be described in more detail with reference to FIGS. 1-7.

Referring to FIG. 1, an image sensor according to the inventive concept may have basic circuit components that include an active pixel sensor (APS) array 10, a timing generator 20, a row decoder 30, a row driver 40, a correlated double sampler (CDS) 50, an analog-to-digital converter (ADC) 60, a latch unit 70, and a column decoder 80.

The APS array 10 is a two-dimensional array of pixels (also referred to as pixel sensors) that include photoelectric conversion devices which convert optical images into electrical output signals. The pixels are driven by multiple driving signals (such as a row selection signal, a reset signal, and a charge transmission signal) transmitted from the row driver 40. In particular, the row driver 40 provides the APS array 10 with driving signals according to decoded information produced by the row decoder 30, to drive the pixels. In general, in this case, the driving signals are issued to rows of the pixels, respectively.

On the other hand, the electrical signals output by the APS array 10 are delivered to the CDS 50 through vertical signal lines. The CDS 50 performs hold and sampling operations on the pixels of the APS array 10. More specifically, the CDS 50 measures the values of reference signals (reference voltages) of the pixels of the APS array 10 and the values of signals output by the pixels (signal voltages), and outputs signals whose values are the difference between the reference signals and the output signals. Thus, noise is reduced.

The timing generator 20 provides timing and control signals to the row decoder 30 and the column decoder 80.

The ADS 60 converts analog signals output by the CDS 50 to digital signals.

The latch unit 70 stores a state of (latches) the digital signals and the latched signals are sequentially sent to an image signal processor (not shown) according to decoding information produced by the column decoder 80.

Figure 2:
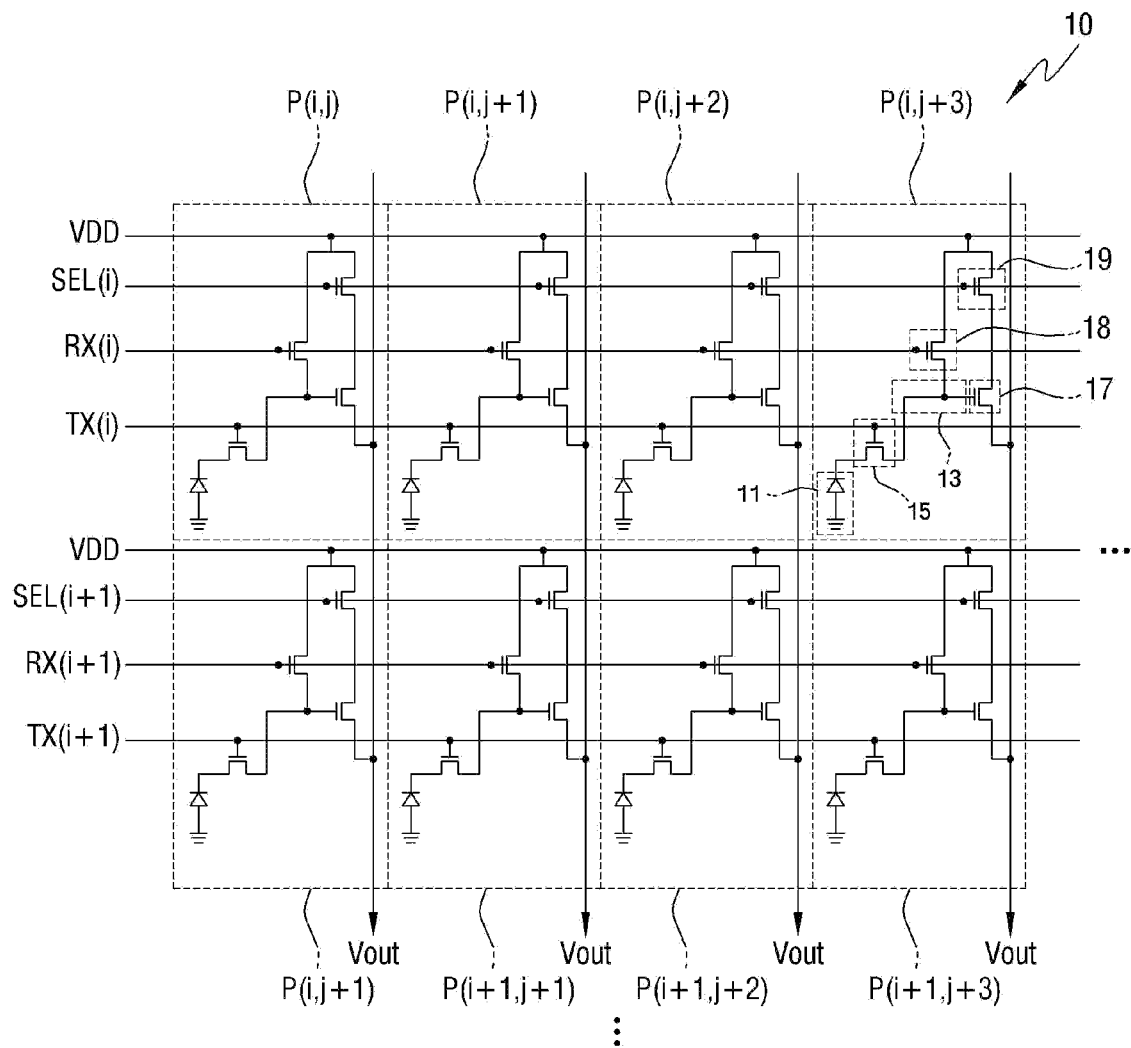
FIG. 2 is an equivalent circuit diagram of an active pixel sensor (APS) array of the image sensor shown in FIG. 1.

The APS array 10 may constitute an integrated circuit equivalent to that shown in FIG. 2.

Referring to FIG. 2, the pixels P are arranged in a matrix of rows 'i' and columns 'j'. Each pixel P may include a photoelectric conversion device 11, a floating diffusion region 13, a charge transmission device 15, a drive device 17, a reset device 18, and a selection device 19. In addition, transmission lines TX, reset lines RX, and row selection lines SEL extend in the direction of the rows of pixels P as disposed substantially parallel to each other and as divided into a plurality of groups. Each group of transmission TX, reset RX and row selection SEL lines is electrically connected to a respective row of the pixels P. The function of these devices and lines will be described using an $i^{th}$ row of pixels (P(i, j), P(i, j+1), P(i, j+2), P(i, j+3), . . . ) as an example.

The photoelectric conversion device 11 of each pixel P absorbs incident light and accumulates electric charges corresponding to the amount of the incident light. The photoelectric conversion device 11 may be a PN photodiode, a phototransistor, a photogate, a pinned photodiode, or may comprise a combination of these elements.

The photoelectric conversion device 11 is coupled to the charge transmission device 15 which transmits the accumulated electric charges to the floating diffusion region 13. The charges accumulate in the floating diffusion region 13 because of parasitic capacitance of the floating diffusion region 13. Thus, electric potential in the floating diffusion region 13 changes over time as more charges accumulate in the region.

The drive device 17, exemplified as a source follower amplifier, amplifies the changes in electric potential in the floating diffusion region 13, and outputs signals corresponding to the amplified changes to an output line Vout.

The reset device 18 periodically resets the floating diffusion region 13. The reset device 18 may be a metal oxide semiconductor (MOS) transistor driven by a bias provided via reset line RX(i). When the reset device 18 is turned on by the bias provided by the reset line RX(i), the electric potential provided to a drain of the reset device 18, for example, a source voltage VDD, is delivered to the floating diffusion region 13.

The selection device 19 selects the pixel P to be read in each row. The selection device 19 may be a MOS transistor driven by a bias provided via a row selection line SEL(i). When the selection device 19 is turned on by the bias provided by the row selection line SEL(i), the electric potential provided to a drain of the selection device 19, for example, the source voltage VDD, is delivered to a drain of the drive device 17.

The structure of an embodiment of an image sensor according to the inventive concept will now be described in more detail with reference to FIGS. 3 and 4.

The image sensor has a light receiving region I and a circuit region II. The circuit region II may surround the light receiving region I.

The light receiving region I is a region of the image sensor occupied by the APS array 10. The receiving region I in this embodiment is rectangular. The circuit region II in this embodiment is a region of the image sensor occupied by circuits electrically connected to the APS array 10.

In general, the image sensor has a substrate 110, circuits 210 and 220 (see FIG. 4) in the circuit region II, and a plurality of upper pads 151 and 152 disposed on the substrate 110 in the circuit region II.

The substrate 110 may be a bulk substrate of a first conductivity type (e.g., a P type) or a second conductivity type (e.g., an N type). Alternatively, the substrate 110 may comprise a bulk substrate of the first or second conductivity type and an epitaxial layer of the first conductivity type or the second conductivity type (grown) on the bulk substrate. Still further, the substrate 110 may consist of an epitaxial layer (that was formed on a bulk substrate which was subsequently removed by a polishing process), or may comprise both an epitaxial layer and thinned substrate (a bulk substrate on which the epitaxial layer was grown and which was subsequently polished to reduce the thickness thereof). However, the image sensor according to the inventive concept is not limited to having a semiconductor substrate. Rather, the substrate 110 may be an organic plastic substrate.

In the illustrated example of the present embodiment, the substrate 110 consists of an epitaxial layer. In another example of an image sensor according to the inventive concept, the substrate 110 comprises an epitaxial layer and a thinned substrate whose thickness is approximately 3 to 5 μm.

Each of the circuits 210 and 220 may include a plurality of wiring layers and wiring contacts which connect the wiring layers. The circuits 210 and 220 drive and deliver the output of the APS array 10. For example, the circuits 210 and 220 constitute the timing generator 20, the row decoder 30, the row driver 40, the CDS 50, the ADC 60, the latch unit 70, and the column decoder 80 shown in and described above with reference to FIG. 1.

Figure 4:
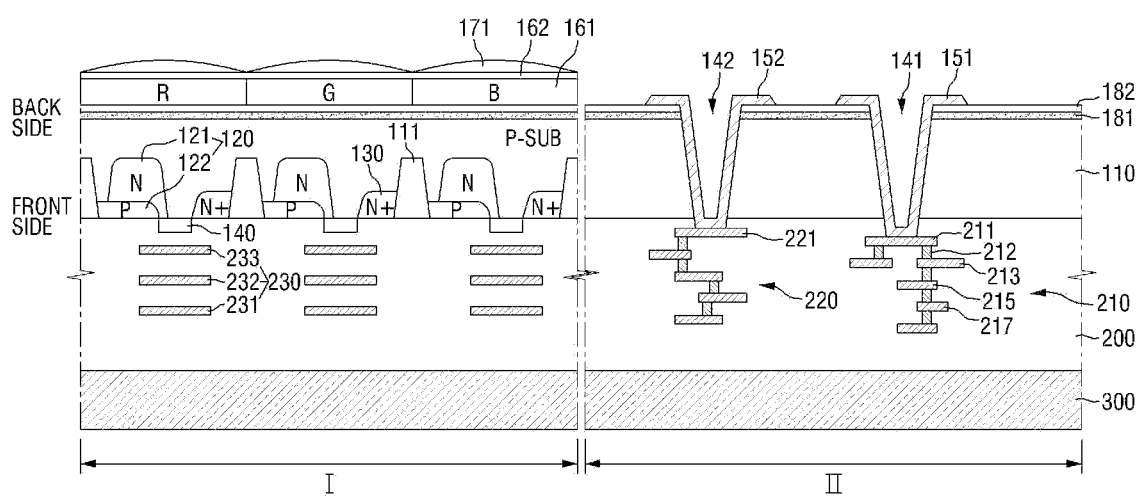
FIG. 4 is a cross-sectional view of a portion of a light receiving region I of the image sensor and of a portion of a circuit region II of the same taken along line A-A' in FIG. 3.
Figure 5:
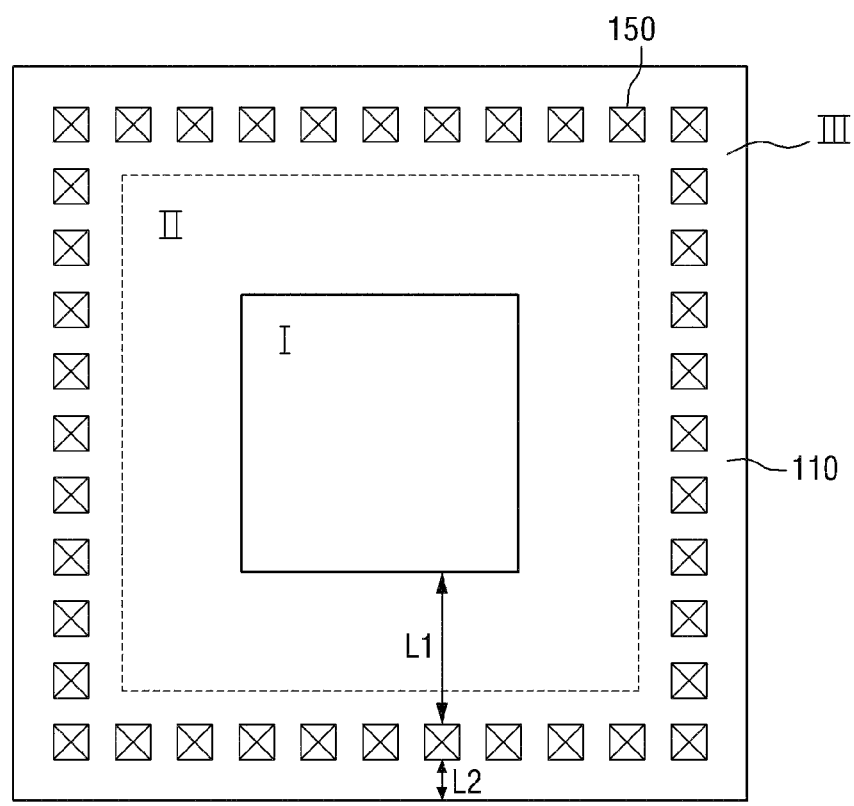
FIG. 5 is a plan view of an image sensor as a comparative example for use in illustrating the advantages of an image sensor according to the inventive concept.

In the example shown in FIG. 4, the first circuit 210 and the second circuit 220 each include first through fourth wiring layers 211 or 221, 213, 215 and 217 and wiring contacts 212 which connect the first through fourth wiring layers 211 or 221, 213, 215 and 217. However, each of the first and second circuits 210 and 220 may have a different numbers of wiring layers and contacts. In any case, the wiring layers of these circuits 210 and 220 consist of active wiring, i.e., do not include any dummy patterns of wiring.

Figure 3:
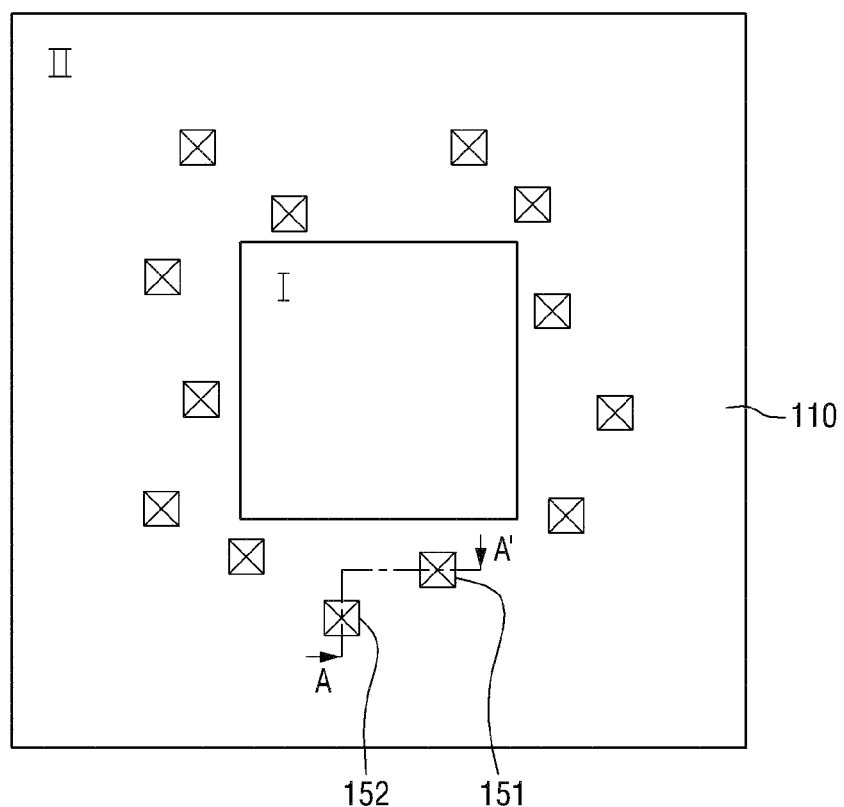
FIG. 3 is a plan view of a first embodiment of an image sensor according to the inventive concept.

Still referring to FIGS. 3 and 4, the upper pads 151 and 152 can be connected to an external semiconductor chip or an external circuit board. Note, the upper pads 151 and 152 are not situated along the outer periphery of the circuit region II but randomly within the circuit region II.

More specifically, the circuits 210 and 220 in the circuit region II are disposed on a front side of a substrate 110, and the upper pads 151 and 152 are disposed on the backside of the substrate 110 as juxtaposed (vertically aligned) with circuits 210 and 220, respectively (as best seen in FIG. 4). Compare this to the layout of an image sensor shown in FIG. 5. In this image sensor, a pad region III is provided around the circuit region II, and pads for connecting the image sensor to an external electronic component are provided in the pad region III. An image sensor having pads laid out in this way thus requires a significant amount of space, i.e., a relatively large footprint. On the other hand, an image sensor according to the inventive concept is relatively small.

Referring again to FIGS. 3 and 4, an active region of the substrate 110 is defined by a device isolation region 111. The device isolation region 111 may be a shallow trench isolation (STI) region or a local oxidation of silicon (LOCOS) region.

The APS array 10 of the image sensor includes a plurality of photoelectric conversion devices 120 and a plurality of floating diffusion regions 130 formed within the substrate 110 in the light receiving region I, and a plurality of gates 140 disposed on the front side of the substrate 110 in the light receiving region I. The gates 140 may include a gate of a charge transmission device, a gate of a reset device, and a gate of a drive device. In the illustrated example of this embodiment, the photoelectric conversion devices 120 are photodiodes. More specifically, each of the photoelectric conversion devices 120 includes an impurity region 121 of the second conductivity type (e.g., the N type) and an impurity region 122 of the first conductivity type (e.g., the P type).

A circuit containing insulating structure (referred to hereinafter simply as an "insulating structure") is disposed on the front side of the substrate 110. The insulating structure includes an interlayer insulating layer 200, metal wiring 230 which includes individual layers of wiring 231, 232, 233 vertically juxtaposed in the light receiving region I, and the circuits 210 and 220 in the circuit region II. The metal wiring 230 is electrically connected to respective ones of the gates 140 and circuits 210, 220 thereby electrically connecting the photoelectric conversion devices 120 to the circuits 210, 220.

The image sensor also has contact holes, e.g., a first contact hole 141 and a second contact hole 142, extending through the substrate 110 and into the interlayer insulating layer 200 of the insulating structure. The contact holes 141 and 142 extend to, i.e., expose, the circuits 210 and 220 in the interlayer insulating layer, respectively. In particular, the first contact hole 141 and the second contact hole 142 expose the first wiring layers 211 and 221 located at the top of the circuits 210 and 220, respectively.

The upper pads 151 and 152 extend from the backside of the substrate 110 into the contact holes 141 and 142 and are electrically connected to the circuits 210 and 220, respectively. In this respect, the upper pads 151 and 152 may be segments of a conformal conductive layer that occupy only portions of the contact holes 141 and 142 or may fill the contact holes 141 and 142, respectively. In the illustrated example in which the upper pads 151 and occupy only portions of the contact holes 141 and 142, the upper pads 151 and 152 also have portions that extend over the backside of the substrate 100 so that they can be readily connected to an external circuit using a method such as wire bonding.

The image sensor may also have a support substrate 300 fixed to the insulating structure by adhesive, for example (which will be described in more detail with reference to FIG. 11). In this case, the support substrate 300 is designed to reinforce the substrate 110 especially in the case in which the thickness of the original substrate has been reduced by a polishing process. The support substrate 300 may be a semiconductor substrate of any material that has a relatively high mechanical strength, such as an organic substrate.

The image sensor may also have a reflection preventing layer 181 disposed on the backside of the substrate 110. The material/thickness of the reflection preventing layer 181 will in general depend on the wavelength of light used in a photo process. The reflection preventing layer 181 may be a laminate of a film of silicon oxide having a thickness of approximately 50 to 200 Å and a film of silicon nitride layer having a thickness of approximately 300 to 500 Å.

A buffer layer 182 may be disposed on the reflection preventing layer 181. The buffer layer 182 is designed to prevent the substrate 110 from being damaged during a patterning process performed to form the upper pads 151 and 152. The buffer layer 182 may be a silicon oxide layer having a thickness of approximately 3000 to 8000 Å.

The image sensor may also have color filters 161 disposed on the backside of the substrate 110 in the light receiving region I at locations corresponding to the photoelectric conversion devices 120, respectively. When the photoelectric conversion devices 120 are arranged in a matrix, the color filters 161 are also arranged in a matrix. In order to obtain a high-quality image, each of the color filters 161 transmits light of a predetermined color therethrough, so that the color reaches a corresponding one of the photoelectric conversion devices 120. The color filters 161 may be red (R), green (G) and blue (B) color filters arranged in a Bayer pattern.

Furthermore, in this embodiment, microlenses 171 are disposed on the color filters 161. The microlenses 171 focus the light on the photoelectric conversion devices 120.

A planarization layer 162 may be interposed between the color filters 161 and the microlenses 171. The planarization layer 162 may be a layer of thermosetting resin. The planarization layer 162 may also be referred to as an over-coating layer (OCL).

Hereinafter, another example of the first embodiment of an image sensor according to of the inventive concept, shown in FIG. 6, will be compared to the example of an image sensor described above with reference to FIG. 5.

Figure 6:
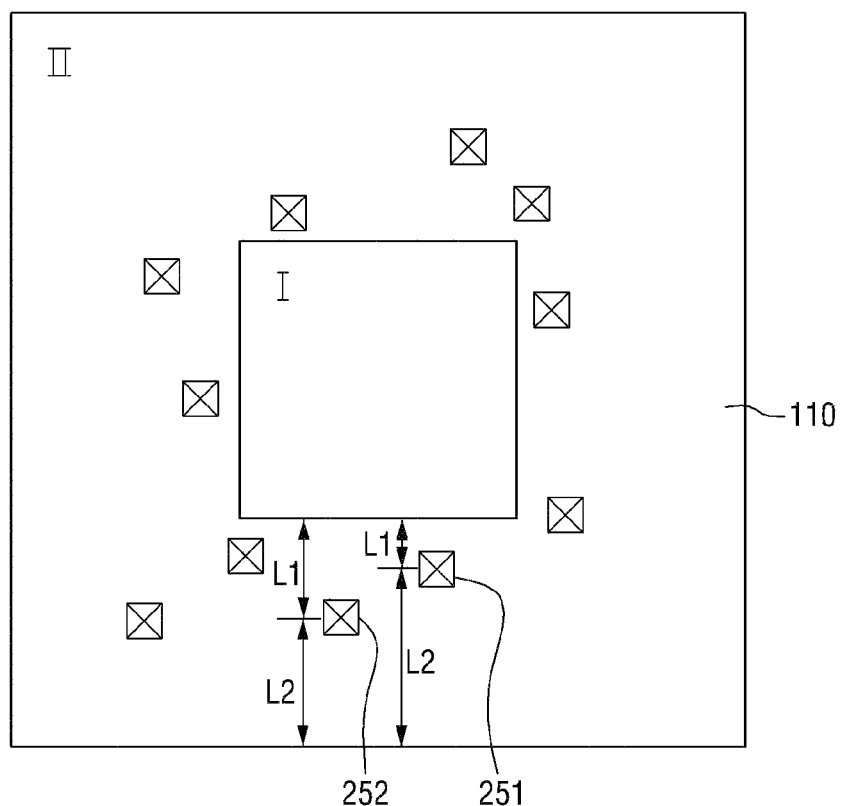
FIG. 6 is a plan view of another example of the first embodiment of an image sensor according to the inventive concept.

Referring to FIG. 6, at least one of the upper pads in the circuit region II are disposed adjacent to the light receiving region I, meaning that at least one of the upper pads is/are disposed closer to the light receiving region I than to the outer periphery of the image sensor. In FIG. 6, first and second upper pads 251 and 252 will be used as an example of the at least one upper pad disposed "adjacent" to the light receiving region II.

Again, as was the case described above with respect to the example of FIGS. 3 and 4, the upper pads 251 and 252 lie directly over the circuits 210 and 220 (see FIG. 4) disposed on the front side of the substrate 110. Therefore, the distance L1 between either of the pads 251 and 252 and the light receiving region I is shorter than the distance L2 between either of the pads 251 or 252 and the outer periphery of the circuit region II. This basically becomes the case because the driving circuits in the circuit region II are located adjacent to the light receiving region I, and the pads 251 and 252 are formed in alignment (vertically) with the driving circuits. On the other hand, referring to the example shown in FIG. 5 in which the pad region III is provided around the circuit region II, the distance L2 between the pads 150 and the outer periphery of the substrate 110 is smaller than the distance L1 between the pads 150 and the light receiving region I of the substrate 110. Note, in these respects, all of the above-mentioned distances L1 and L2 are the shortest distances from the center of the pad to the outer boundaries of the light receiving and circuit regions I and II, respectively, as is clear from the figure.

Also, in this example in which the light receiving region I is rectangular (with sides extending in the direction of the rows and columns of the pixels P), and the outer periphery of the image sensor, i.e., the outer boundary of the circuit region II, is also rectangular, the above-mentioned distances L1 are the short line distances between the center of a pad and the closest side or an extension of the closest side of the rectangular outer boundary of the light receiving region I. Similarly, the above-mentioned distances L2 are the short line distances between the center of a pad and the closest outer side of the circuit region II. Hence, the distances L1 and L2 are orthogonal to the closest outer sides of the light receiving and circuit regions I and II.

Figure 7:
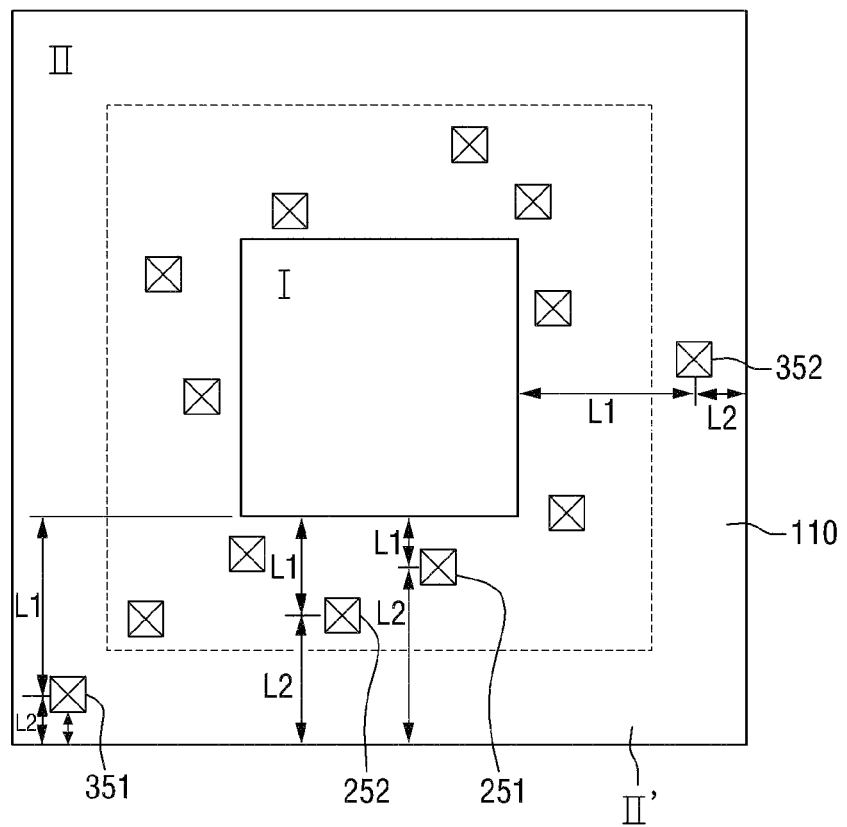
FIG. 7 is a plan view of another embodiment of an image sensor according to the inventive concept.

Another embodiment of an image sensor according to the inventive concept is shown in FIG. 7. In this embodiment, at least one upper pad is disposed adjacent to the light receiving region I and at least one upper pad is disposed adjacent the outer peripheral edge II' of the sensor constituted by the outer boundary of the circuit region II.

In the illustrated example of this embodiment, the image sensor includes in the circuit region II a first upper pad 251 and a second upper pad 252 disposed adjacent to the light receiving region I, and third upper pads 351 and 352 which are disposed just inside the outer peripheral edges II' of the image sensor. Specifically, each distance L1 between a first and second upper pad 251 and 252 and the boundary of the light receiving region I closest thereto is smaller than the distance L2 between that upper pad 251 and 252 and the outer periphery of the circuit region II. In addition, the distance L2 between each of the third upper pads 351 and 352 and the outer periphery of the circuit region II is smaller than the distance L1 between that third upper pad 351 and 352 and the light receiving region I. Although not shown in FIG. 7, circuits (e.g., driving circuits) are disposed on a front side of a substrate directly under the first through third upper pads 251, 252, 351 and 352, respectively. Thus, for the reasons described above, there is no need to form a pad region.

Figure 8:
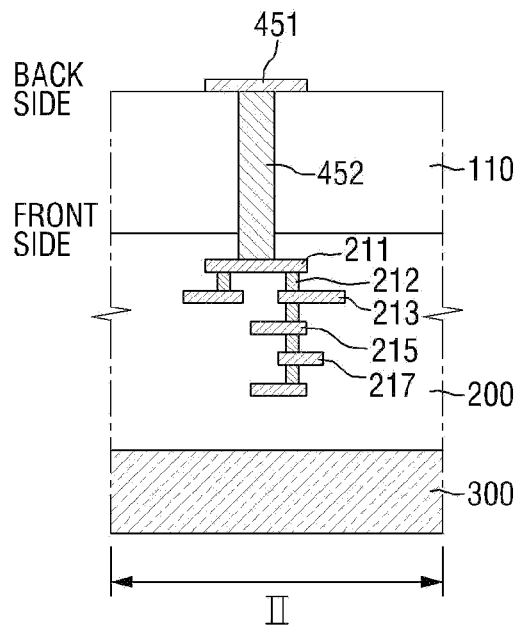
FIG. 8 is a cross-sectional view of another version of pad structure of an image sensor according to the inventive concept.
Figure 9:
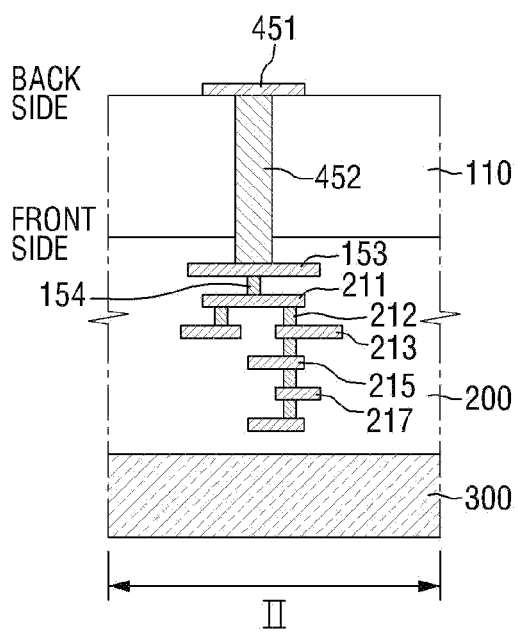
FIG. 9 is a cross-sectional view of another version of pad structure of an image sensor according to the inventive concept.

FIGS. 8 and 9 show other versions of pad structures of an image sensor according to the inventive concept. The pad structures shown in FIGS. 8 and 9 may be applied to the embodiments of FIGS. 3, 6 and 7 described above.

Referring to FIG. 8, the image sensor includes a contact 452 which extends through the substrate 110 in the circuit region II, and an upper pad 451 disposed on the back side of the substrate 110 in contact with the contact 452. In particular, the contact 452 contacts a circuit (210 or 220 in FIG. 4) comprising the layers of wiring 211, 212, 213, 215 and 217. In the illustrated example, the contact 452 contacts an uppermost one of the layers of wiring 211, 212, 213, 215 and 217 that constitute the circuit. Therefore, the upper pad 451 is electrically connected by the contact 452 to the circuit.

Alternatively, the contact 452 may contact the second or third layer of wiring from the top (namely, layer of wiring 212 or 213 in the figure).

Referring to FIG. 9, the insulating structure includes a lower pad 153 and a lower pad contact 154 in addition to interlayer insulating layer 200, and layers of wiring 211, 212, 213, 215 and 217. The lower pad 153 is electrically connected to the circuit comprising the layers of wiring 211, 212, 213, 215 and 217. Specifically, the lower pad 153 is connected to the circuit by the lower pad contact 154. The lower pad contact 154 may contact the uppermost one of the layers of wiring, namely the layer of wiring 211 in the figure, or may instead contact the second 213, third 215, or fourth 217 layer of wiring from the top.

The contact 452 extends into contact with and is thus electrically connected to the lower pad 153. An upper pad 451 is disposed on and contacts the contact 452. Therefore, the upper pad 451 is electrically connected by the contact 452 to the lower pad 153 and hence, to the circuit. The lower pad 153 not only makes it easy to electrically connect the upper pad 451 to the circuit but also minimizes contact resistance.

Hereinafter, a method of fabricating an image sensor according to the inventive concept will be described with reference to FIGS. 10 through 15.

Figure 10:
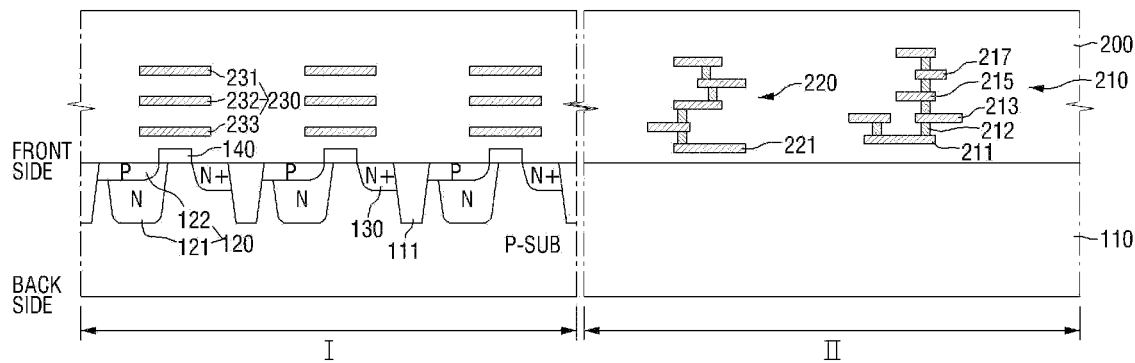
FIGS. 10 through 15 are cross-sectional views of intermediate structures, illustrating a method of fabricating an image sensor according to the inventive concept.

Referring first to FIG. 10, device isolation region 111, such as an STI region or a deep trench isolation (DTI) region, is formed in substrate 110. The outer boundary of the device isolation layer coincides with the boundary between a light receiving region I and a circuit region II of the image sensor.

Furthermore, pixels are formed in the light receiving region I. Specifically, photoelectric conversion devices 120 (e.g., photodiodes) and floating diffusion regions 130 are formed in the substrate 110 in the light receiving region I, and gates 140 are formed on the substrate 110 in the light receiving region I. The gates 140 may include the gate of a charge transmission device, the gate of a reset device, and the gate of a drive device.

Then, the insulating structure, including interlayer insulating layer 200, layers of wiring 230, and first and second circuits 210 and 220, is formed on the front side of the substrate 110.

Figure 11:
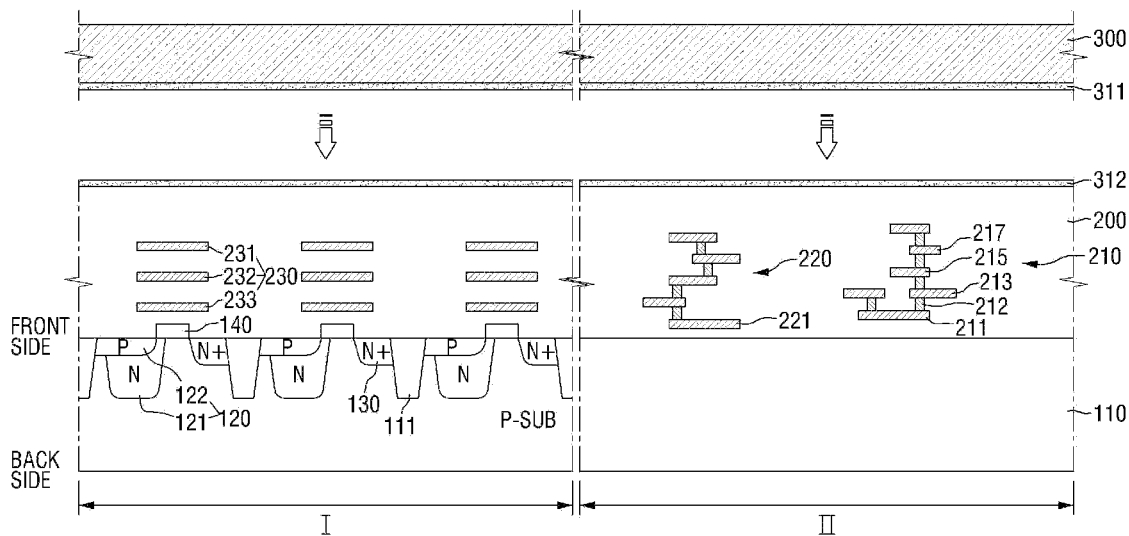

Referring to FIG. 11, support substrate 300 is adhered to the insulating structure.

Specifically, an adhesive layer 312 is formed on the insulating structure to ensure that a flat surface is presented. In addition, an adhesive layer 311 is formed on the support substrate 300. Then, the adhesive layers 311 and 312 are pressed against each other, thereby adhering the substrate 110 to the support substrate 300. When the support substrate 300 is a silicon substrate, the adhesive layers 311 and 312 may be, for example, silicon oxide layers.

Figure 12:
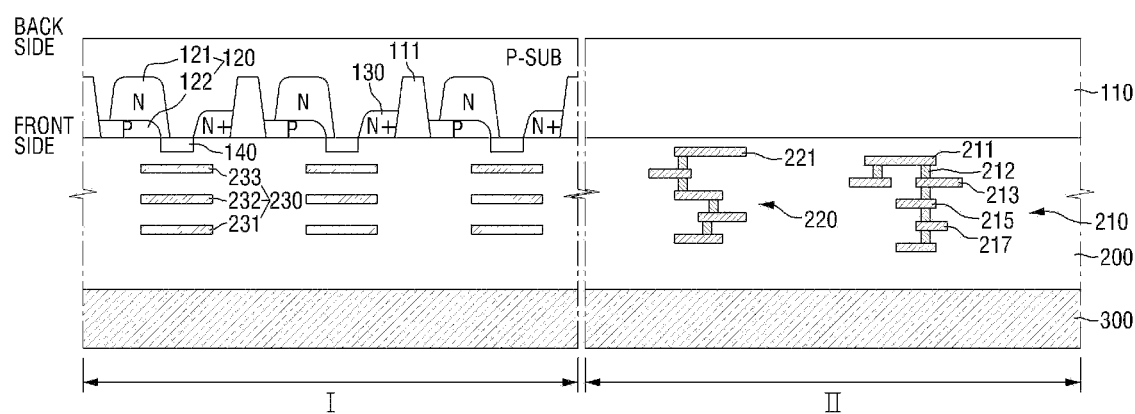

Referring to FIG. 12, the substrate 110 is inverted, and then a backside of the substrate 110 is polished.

The backside of the substrate 110 may be polished by chemical mechanical polishing (CMP), back grinding (BGR), reactive ion etching, or a combination of the same. The thinned substrate 110 which remains after the polishing process preferably has a thickness of approximately 3 to 5 μm.

Figure 13:
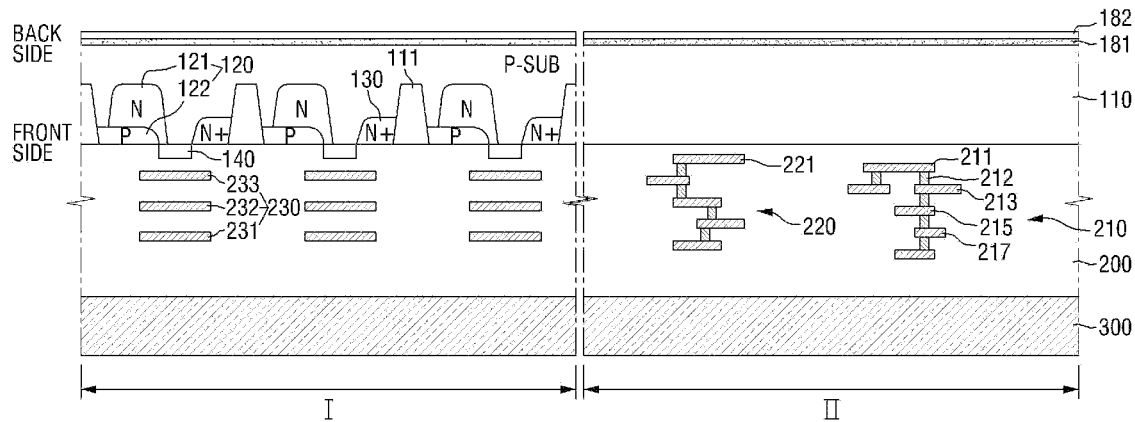

Referring to FIG. 13, a reflection preventing layer 181 is formed on the backside of the substrate 110. The reflection preventing layer 181 may be formed forming a silicon oxide layer to a thickness of approximately 50 to 200 Å on the substrate 110 by chemical vapor deposition (CVD), and then by forming a silicon nitride layer to a thickness of approximately 300 to 500 Å on the silicon oxide layer also by CVD.

Next, a buffer layer 182 is formed on the reflection preventing layer 181. The buffer layer 182 may be formed by forming a silicon oxide layer to a thickness of approximately 3000 to 8000 Å using CVD.

Figure 14:
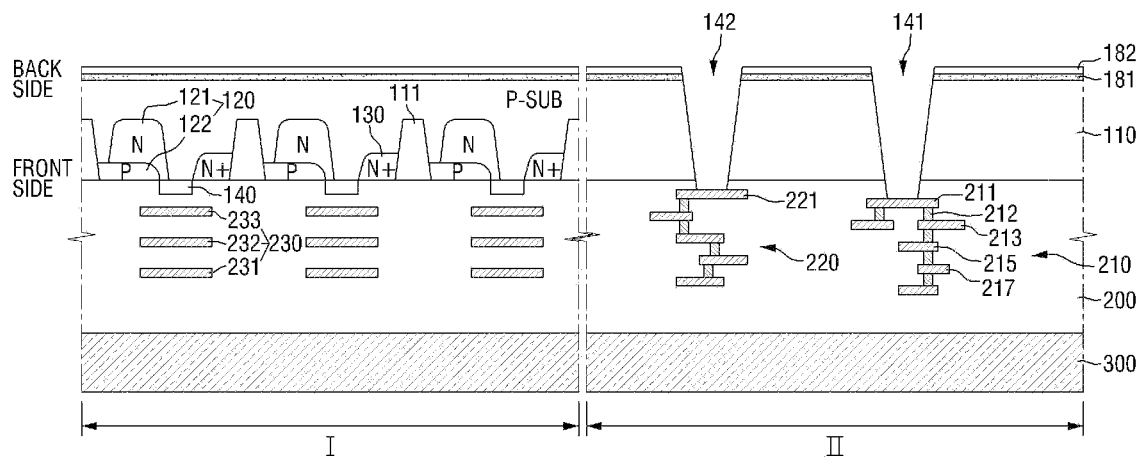

Referring to FIG. 14, contact holes 141 and 142 are formed through the substrate 110 and into the insulating structure, in the circuit region II.

Specifically, a photoresist pattern (not shown) is formed on the buffer layer 182, and the buffer layer 182, the reflection preventing layer 181 and the substrate 110 are etched using the photoresist pattern as a mask to expose the first and second circuits 210 and 220. In this respect, an anisotropic etching process may be employed to form the contact holes 141 and 142.

Figure 15:
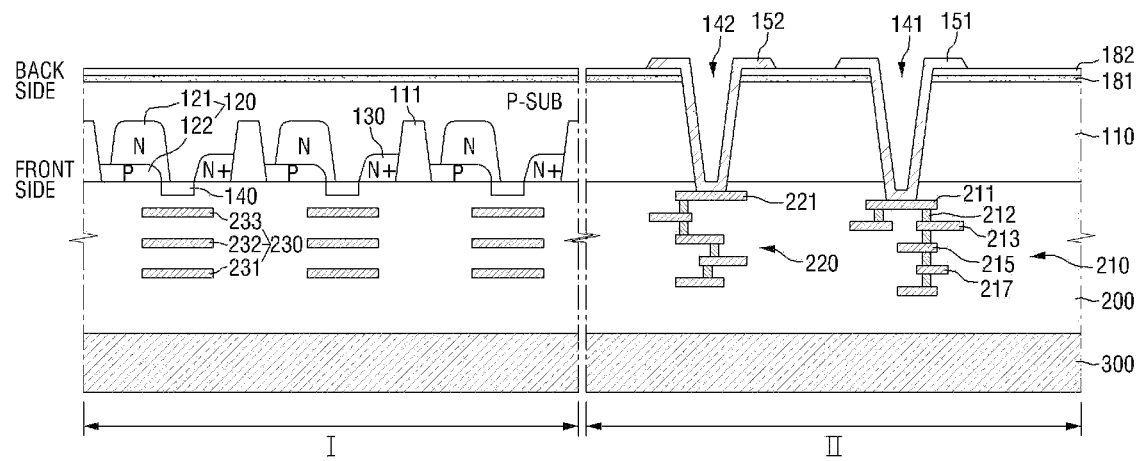

Referring to FIG. 15, next, upper pads 151 and 152 are formed.

Specifically, a conductive layer (conformal as in the illustrated case or blanket) is formed on the buffer layer 182, and a photoresist pattern is formed on the conductive layer. Then, the conductive layer is etched using the photoresist pattern as a mask to form upper pads 151 and 152 that contact the first and second circuits 210 and 220, respectively.

Although not shown in the drawing, color filters 161 (see FIG. 4) corresponding to the photoelectric conversion devices 120, respectively, are then formed on the backside of the substrate 110 in the light receiving region I. The color filters 161 may be formed using a dyeing method, a pigment dispersion method, a printing method or the like. For example, each color filter 161 may be made of dyed photoresist so as to constitute a red, green or blue color filter. Next, a planarization layer 162 of a polyimideor polyacrylic polymer having superior light transmittance(see FIG. 4) may be formed on the color filters 161. Then, microlenses 171 corresponding to the photoelectric conversion devices 120, respectively (see FIG. 4), are formed on the planarization layer 162. For example, patterns of light transmissive photoresist are formed over the photoelectric conversion devices 120 and then reflowed. Accordingly, convex microlenses 171 are formed on the planarization layer 162.

Figure 16:
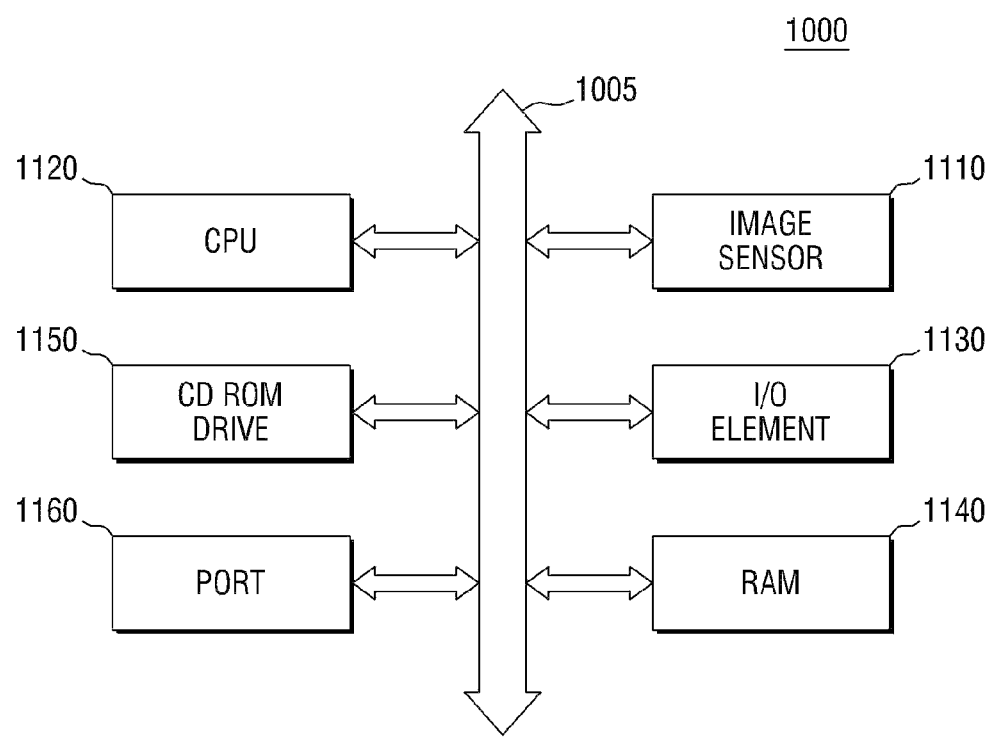
FIG. 16 is a schematic block diagram of a processor-based system including an image sensor according to the inventive concept.

A processor-based system 1000 including a CMOS image sensor 1110 according to the inventive concept is shown in FIG. 16. The processor-based system 1000 is exemplified by, but is not limited to, a computer system. Other examples include a camera system, a mechanized clock system, a navigation system, a video phone, a supervision system, an auto focus system, a trace system, a surveillance system, a motion monitoring system, and an image stabilization system.

The processor-based system 1000 of this example includes a central processing unit (CPU) 1120 such as a microprocessor that can communicate with an input/output (I/O) element 1130 through a bus 1005. The CMOS image sensor 1110 can communicate with a system through the bus 305, as shown, or through another communication link. Also, the processor-based system 1000 can additionally include a RAM 1140, a CD ROM drive 1150, and/or a port 1160 that can communicate with the CPU 1120 through the bus 1005. The port 1160 can be coupled with, for example, a video card, a sound card, a memory card, and a USB device, or can perform data communications with other kinds of electronic cards, devices or systems. Also, the CMOS image sensor 1110 can be integrated with the CPU 1120 (as shown), digital signal processor (DSP), or separate microprocessor, in a chip. Also, a memory can be integrated with the image sensor 110 or it may be part of a separate chip that does not include a processor.

As described above, an image sensor according to the inventive concept does not include a pad region at the outer periphery thereof. Instead, pads are formed at locations that are vertically aligned with the circuits, e.g., the driving circuits adjacent the light receiving region. Therefore, there is no need to form dummy wiring layers beneath the pads and/or an extensive amount of wiring that extends all the way from the circuits to the outer periphery of the image sensor. Thus, an image sensor can be fabricated simply according to the inventive concept and has minimal resistance between the circuits and the pads. Also, the pads are supported by a substrate. Therefore, the circuits under the pads will not be damaged when a wire bonding process is performed to connect the pads to an external circuit.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. An image sensor having a light receiving region and a circuit region extending around the light receiving region, and comprising:
   a substrate having a front side and a back side;
   a pixel sensor disposed at the front side of the substrate in the light receiving region;
   a circuit-containing insulating structure comprising an insulating layer of electrical insulating material covering the front side of the substrate in both the circuit region and the light receiving region;
   circuits configured to drive and deliver the output of the pixel sensor, wherein the circuits reside exclusively within the insulating layer in the circuit region;
   a contact extending through the substrate and to the circuits; and
   an upper conductive pad on the back side of the substrate as vertically aligned with and electrically connected to the circuits,
   wherein the pixel sensor comprise photodetectors within the substrate and the circuits dispose to vertically misalign with the contact and at least one of the circuits disposes not to overlap the contact.

2. The image sensor of claim 1, wherein each of the circuits comprises multiple layers of wiring.

3. The image sensor of claim 2, further comprising a lower conductive pad of conductive material disposed in the insulating layer in the circuit region and electrically connected to the circuits, and wherein the lower conductive pad is electrically connected to the upper conductive pad.

4. The image sensor of claim 1, further comprising a device isolation structure extending in the substrate and defining active regions of the substrate in which the pixel sensor is disposed, an outer peripheral portion of the device isolation structure constituting the border between the light receiving region and the circuit region such that the circuit region is the region of the image sensor outside the outer peripheral portion of the device isolation structure and the light receiving region is the region of the image sensor inside the outer peripheral portion of the device isolation structure.

5. The image sensor of claim 1, wherein each of the circuits comprises multiple layers of active wiring within the insulating layer, and the upper conductive pad extends directly over active wiring in each of the layers of a respective one of the circuits.

6. The image sensor of claim 1, wherein the substrate is a substrate comprising semiconductor material.

\* \* \* \* \*